(12) United States Patent
Cok

(10) Patent No.: US 8,445,853 B2
(45) Date of Patent: May 21, 2013

(54) METHOD OF MAKING A RADIATION-SENSITIVE SUBSTRATE

(75) Inventor: Ronald Steven Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 24 days.

(21) Appl. No.: 13/214,550

(22) Filed: Aug. 22, 2011

(65) Prior Publication Data

US 2013/0048868 A1   Feb. 28, 2013

(51) Int. Cl.
*H01L 27/146* (2006.01)
(52) U.S. Cl.
USPC .................................................. 250/370.08
(58) Field of Classification Search
USPC ........................................ 250/370.01–370.15
See application file for complete search history.

(56) References Cited

U.S. PATENT DOCUMENTS

| | | | |
|---|---|---|---|
| 5,381,014 A | 1/1995 | Jeromin | |
| 5,581,094 A * | 12/1996 | Hara et al. | 257/80 |
| 6,982,425 B1 | 1/2006 | Rougeot et al. | |
| 7,692,157 B2 | 4/2010 | Rougeot et al. | |
| 2012/0080604 A1 * | 4/2012 | Kim et al. | 250/370.08 |

* cited by examiner

*Primary Examiner* — Kiho Kim
(74) *Attorney, Agent, or Firm* — Raymond L. Owens

(57) ABSTRACT

A method of making a radiation-sensitive apparatus includes providing a first substrate, forming a radiation-sensitive layer over the first substrate, providing a plurality of spatially separated integrated circuits, each integrated circuit having: a second substrate, one or more electronic circuit(s) formed in or on the second substrate, and one or more electrode connection pads formed in or on the second substrate, each electrode connection pad electrically connected to at least one of the electronic circuit(s). A plurality of pixel electrodes is formed over the first substrate separate from the integrated circuit, each pixel electrode electrically connected to an electrode connection pad. An electronic control circuit is electrically connected to each electronic circuit in each integrated circuit. The electronic circuits are responsive to electrical signals formed by the interaction of electromagnetic radiation and the radiation-sensitive layer, the electrical signals conducted by the pixel electrodes and electrode connection pads.

23 Claims, 12 Drawing Sheets

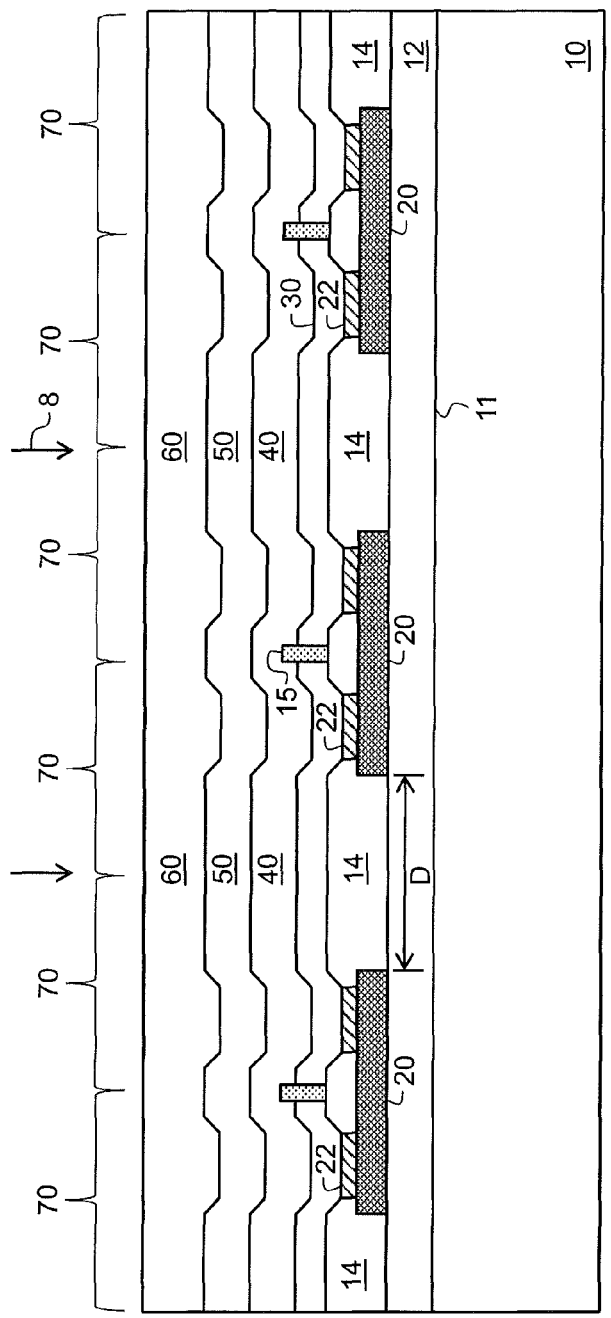
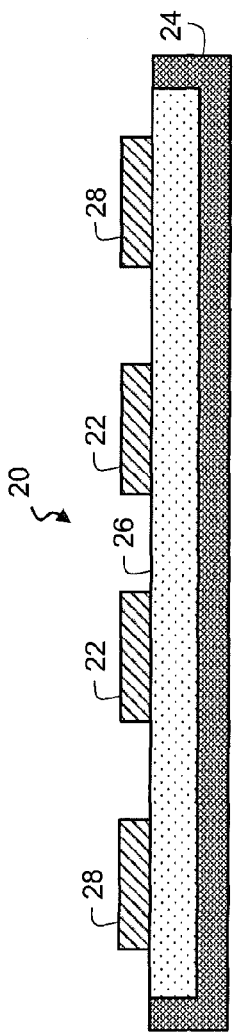

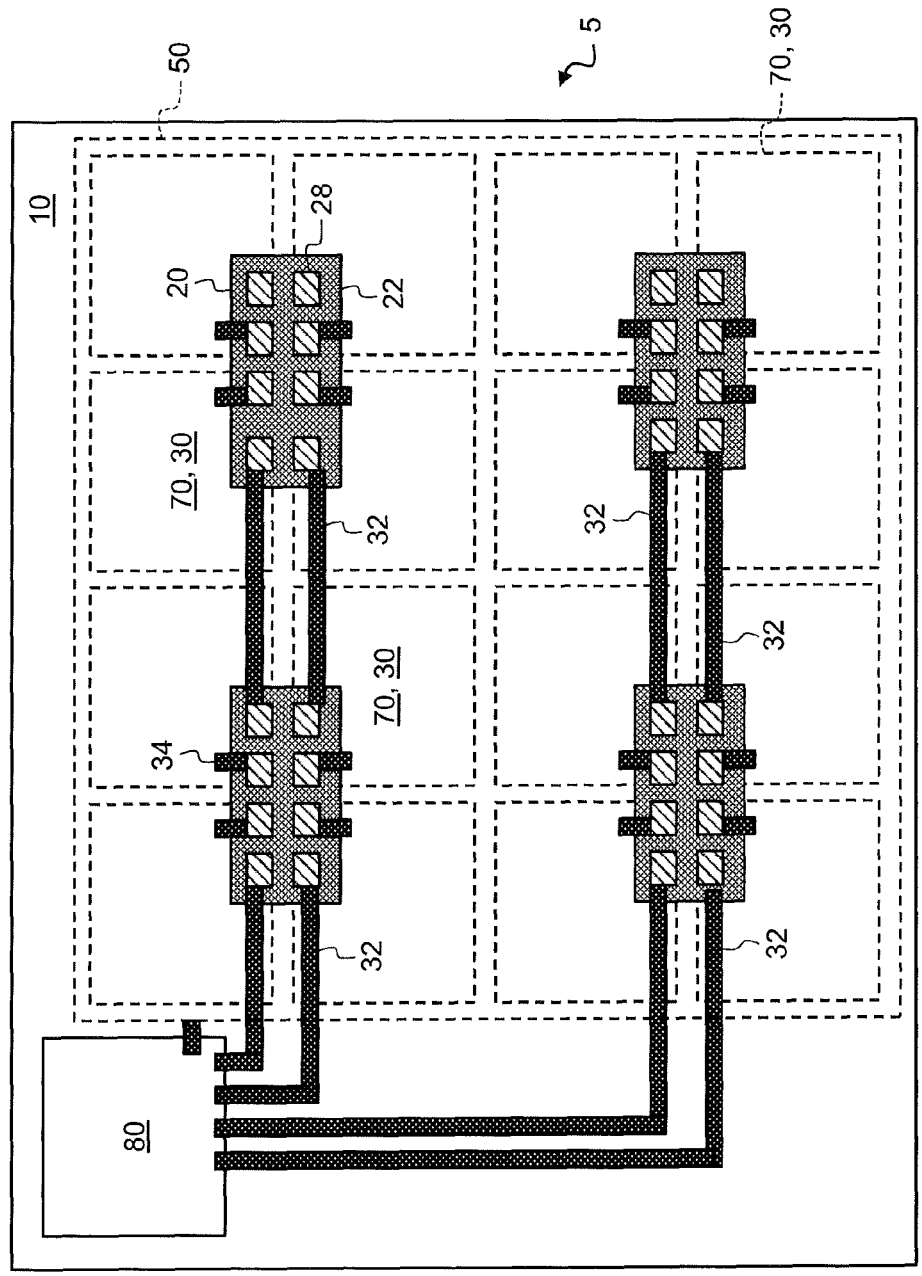

METHOD OF MAKING A RADIATION-SENSITIVE SUBSTRATE

CROSS REFERENCE TO RELATED APPLICATIONS

Reference is made to commonly-assigned, U.S. patent application Ser. No. 13/214,524 filed concurrently herewith, entitled "RADIATION-SENSITIVE SUBSTRATE" by Cok, the disclosure of which is incorporated herein.

FIELD OF THE INVENTION

The present invention relates to a method for detecting radiation to form an image and in particular to making substrates used for digital radiography.

BACKGROUND OF THE INVENTION

High-frequency radiation, such as x-rays, is widely used as diagnostic tools for human diseases and injuries. Radiation-sensitive substrates, such as x-ray film, are exposed to radiation that has passed through portions of the human body thereby forming images of internal structures in the body that have differentially absorbed the radiation. In digital radiographic systems, radiation-sensitive materials coated over a substrate and exposed to radiation form a charge pattern in the coated substrate that can form an image when read with electronic circuits.

Digital radiography can provide advantages in medical or other diagnostic work. For example, digital radiographs are reusable and do not require chemical development, thereby decreasing response time and costs. Digital radiography can also be more sensitive to radiation so that radiation exposure to human subjects is reduced. Despite these advantages, digital radiography is expensive and can suffer from electronic noise that reduces the accuracy of the read charge pattern, reducing its diagnostic value.

The radiation-sensitive substrates in digital radiographic systems form flat-panel detectors. In one type of system, substrates coated with photo-stimulable phosphors are exposed to radiation. The photo-stimulable phosphors are exposed to light to produce a signal whose strength corresponds to the amount of radiation exposure incident on the phosphors. After exposure, the plates are placed in a reader that stimulates the substrate with light, for example using a scanning laser, to retrieve the signal over the area of the substrate to produce an image.

In another type of flat-panel detector, a layer of scintillating material (e.g. cesium iodide or gadolinium oxysulfide) coated over a substrate responds to x-ray radiation by emitting photons in proportion to the quantity of incident radiation. The photons are then detected by amorphous silicon photo-diodes to produce a current that is electronically detected. The photo-diodes are distributed over the area of the substrate to provide multiple signals corresponding to pixels forming an image of the x-ray radiation that is used for diagnosis by a radiologist.

Yet another type of flat-panel detector uses a layer of radiation-sensitive material (e.g. amorphous selenium) coated over a substrate between electrodes that responds to x-ray radiation by forming a charge in proportion to the quantity of incident radiation. The charge forms a pattern corresponding to the incident radiation and is detected by electrodes patterned over the substrate that are connected to electronic circuits. Essentially, an array of capacitors are charged in a pattern corresponding to the radiation pattern and the capacitor charges are read with the electronic circuits to form pixel values forming an image of the x-ray radiation that is used for diagnosis by a radiologist.

It is preferable that any electronic signal produced from a digital radiographic exposure be read accurately and quickly. For large substrates, it is difficult to transfer an electronic signal to circuits separate from the radiation-sensitive substrate at high speed and without adding electronic noise, particularly for the signal-measuring circuitry. Furthermore, it is preferable that any substrate have as large a radiation-sensitive area as possible to provide as high-resolution a signal as possible, for example having as many pixels per unit area as possible.

U.S. Pat. No. 5,381,014 describes a large area x-ray image capture element fabricated by juxtaposing a plurality of discrete array modules in an assembly over the top surface of a base plate, such that each module is disposed adjacent at least one other module to form a two-dimensional mosaic of modules. Each of the discrete modules includes a plurality of thin-form transistors arrayed adjacent the top surface of a dielectric substrate wherein at least one precision-ground edge forms a precise abutment with a precision-ground edge of another substrate. A continuous radiation detecting layer is disposed over the plurality of juxtaposed modules and produces a latent radiographic image in the form of electrical charges. Such a method reduces or totally voids the non-radiation-detecting areas created at the borders between the array modules. However, such a design employs thin-film electronic devices that are known to have lower performance than crystalline semiconductor electronic devices. Furthermore, the assembly of the described structure is problematic.

The location of crystalline integrated circuits over a substrate such as a printed-circuit board is known in the prior art, for example using surface-mount integrated-circuit components, such as ball-grid arrays, multi-chip modules, and flip-chips, as well as soldering the components to the printed-circuit board. A variety of packaging and placement techniques, both manual and automated, are known for assembling electronically active substrates. Such integrated-circuit substrate structures, however, can interfere with the ability of a radiation-sensitive substrate to provide a high-resolution, low-noise, image of radiation incident on the substrate.

There is a need, therefore, for an alternative substrate design for providing a high-resolution, low-noise, image of patterned radiation incident on the substrate.

SUMMARY OF THE INVENTION

The need is met in one embodiment of the present invention by a method of making a radiation-sensitive apparatus, comprising:

providing a first substrate having an active side;

forming a radiation-sensitive layer over the active side of the first substrate;

providing a plurality of spatially separated integrated circuits located on the active side, each integrated circuit having:
- a second individual substrate different and separate from the first substrate;
- one or more electronic circuit(s) formed in or on the second substrate; and
- one or more electrode connection pads formed in or on the second substrate, each electrode connection pad electrically connected to at least one of the electronic circuit(s);

forming a plurality of pixel electrodes over the active side of the first substrate separate from the integrated circuit, each pixel electrode electrically connected to an electrode connection pad;

providing an electronic control circuit electrically connected to each electronic circuits in each integrated circuit; and wherein the electronic circuits are responsive to electrical signals formed by the interaction of electromagnetic radiation and the radiation-sensitive layer, the electrical signals conducted by the pixel electrodes and electrode connection pads.

The present invention provides an improved radiation-sensitive substrate that forms high-resolution and low-noise images in response to patterned radiation exposure.

BRIEF DESCRIPTION OF THE DRAWINGS

FIG. 1 is a cross section of a top-detecting radiation-sensitive apparatus according to an embodiment of the present invention;

FIG. 2 is a cross section of an integrated circuit useful in various embodiments of the present invention;

FIG. 3 is a schematic of a radiation-sensitive apparatus according to an embodiment of the present invention;

Figure 4:
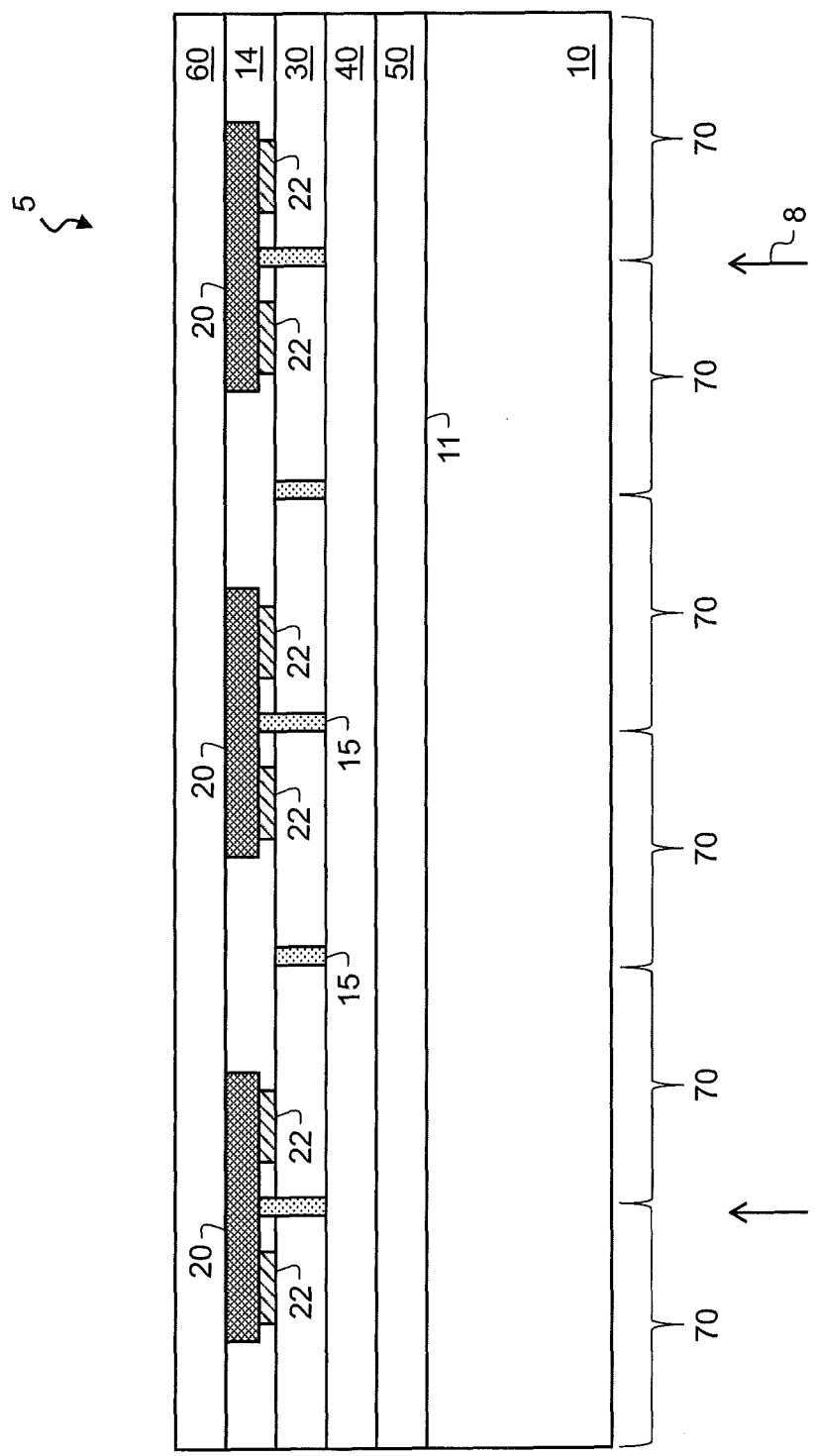
FIG. 4 is a cross section of a bottom-detecting radiation-sensitive apparatus according to an alternative embodiment of the present invention.

Because the various layers and elements in the drawings have greatly different sizes in the various embodiments, the drawings are not to scale.

DETAILED DESCRIPTION OF THE INVENTION

Referring to the cross section of FIG. 1, in one embodiment the present invention includes a radiation-sensitive apparatus 5 including a first substrate 10 having an active side 11. A plurality of layers is formed over the active side 11 of the first substrate 10. A layer formed over the active side 11 of the first substrate 10 is a layer formed on, over, or above the active side 11 of the first substrate 10 or on, over, or above another layer formed on, over, or above the active side 11 of the first substrate 10. Thus, the plurality of layers located on, over, or above, the active side 11 of the first substrate 10 form a multi-layer structure on the active side 11 of the first substrate 10. The layers are largely planar and extend over much, but not necessarily all, of the surface of the first substrate 10 and can be formed through a variety of techniques known in the art, for example by evaporative material deposition, sputtering, coating (e.g spin coating or blade coating) and drying, or by mechanically placing pre-formed elements in a common layer. The first substrate 10 can include any of a variety of materials, for example glass, metal, or plastic, and can be rigid or flexible.

A plurality of spatially separated integrated circuits 20 is located on the active side 11. The integrated circuits 20 do not touch each other and are separated by a distance D greater than zero and are optionally located on an adhesive layer 12 in an approximately planar array in a layer. The adhesive layer 12 is optionally formed, for example, by liquid coating a curable resin adhesive on the first substrate 10, as is known in the photolithographic arts, e.g. by spray, slot, or blade coating and the integrated circuits 20 placed on the adhesive layer 12. As shown in FIG. 2, each integrated circuit 20 includes a second individual substrate 24 different and separate from the first substrate 10. The substrate is optionally crystalline and can include or be made of semiconductor materials, such as silicon or gallium arsenide. Such materials, placement, and processing methods are known in the integrated circuit arts. An encapsulating and insulating layer 14 (FIG. 1) (e.g. using a curable and patternable resin) is optionally formed over the integrated circuits 20 (e.g. by coating) and patterned (e.g. by patterned exposure, curing, and etching) to form openings (vias) through which electrical connections are made to the pixel and control connection pads 22, 28. Such materials and processes are well-known in the integrated circuit and printed circuit board arts.

Referring to the FIG. 2 integrated circuit cross section, the integrated circuits 20 include one or more electronic circuit(s) 26 formed in or on the second substrate 24. One or more pixel connection pads 22 are formed in or on the second substrate 24. Each pixel connection pad 22 is electrically connected to at least one of the electronic circuit(s) 26. Control connection pads 28 connected to the electronic circuits 26 provide an electrical control interface to the integrated circuit 20. Both the pixel connection pads 22 and the control connection pads 28 are electrode connection pads. The electronic circuits 26 are optionally conventional semiconductor circuits, either analog or digital, or both, that are capable of receiving, communicating, transmitting, or processing electrical signals. The electronic circuits 26 can include multiple, similar circuits each connected to a different pixel connection pad 22 for receiving, communicating, transmitting, or processing separate electrical signals conducted through a corresponding pixel connection pad 22. The electronic circuits 26 can include photo-transistors, photo-capacitors, or amplifiers (e.g. transistor circuits) known in the art for receiving, controlling, and processing electrical signals. The integrated circuits 20 are optionally made in a separate process and at a different time from the radiation-sensitive apparatus 5 of the present invention.

Referring back to FIG. 1, a plurality of pixel electrodes 30 are formed over the active side 11 of the first substrate 10 and define pixels 70. The pixel electrodes 30 are separate from the integrated circuit 20, and are not formed on or in the integrated circuit 20 or electrical circuits 26 (FIG. 2) but are formed over the first substrate 10 and electrically connected to the electrical circuits 26 (FIG. 2) through a pixel connection pad 22. The pixel electrodes 30 are optionally segmented and electrically separate from each other to carry separate and distinct electrical signals. Insulators 15 electrically insulate the pixel electrodes 30 from each other and can include such materials as silicon dioxide or cured photo-patterned resins. Such insulating structures and materials are well-known in the integrated circuit and electronic substrate arts and are patterned with well-known processes, such as coating photo-sensitive materials, pattern-wise curing the photo-sensitive materials with a patterned exposure, and etching. Likewise, the pixel electrodes 30 can be patterned using similar well-known photo-lithographic processes.

A radiation-sensitive layer 40 is formed over the active side 11 of the first substrate 10. The radiation-sensitive layer 40 can be formed by deposition methods, such as vapor deposition or sputtering, that are known in the photo-lithographic and integrated circuit arts and can include one or more materials in a common layer. Alternatively, the radiation-sensitive layer 40 can further include sub-layers, each of which can be a different material or different combination of materials. Different sub-layers can have materials in common.

The radiation-sensitive layer 40 is responsive to incident radiation to form an electrical signal. Thus, at least one of the materials in the radiation-sensitive layer is sensitive to radiation. For example, the radiation can directly interact with the radiation-sensitive layer 40 to produce a change in the localized charge of the radiation-sensitive layer 40 or to produce a change in the local resistivity of the radiation-sensitive layer 40 (e.g. through changes in photo-conductivity) that is detected as an electrical signal. The specific material forming the radiation-sensitive layer 40 will depend upon the charge generation or charge transport properties desired in the radiation-sensitive layer 40 and its sensitivity to the desired type of radiation. In one non-limiting example, the radiation is x-ray radiation. In another non-limiting example, the radiation is light.

In another example, the electrical signal is indirectly produced. In this example, incident radiation (e.g. x-rays) interacts with at least one scintillating material in the radiation-sensitive layer 40 to cause secondary emission of a lower frequency radiation, for example, light. The light is then detected using conventional photo-sensing structures, such as photodiodes using silicon, that produce an electrical signal in response to the secondary light emission. In this embodiment, at least two materials are used in the radiation-sensitive layer 40, a scintillating material and a light-responsive material. The arrangement, composition and layer thickness of such materials are known in the digital radiographic and the photo-sensing arts.

According to various embodiments of the present invention, different kinds of radiation-sensing materials are used and can take a variety of forms, such as amorphous, crystalline, or polycrystalline. Useful radiation-sensing materials include silicon, selenium, cadmium sulfide, mercuric iodide, or lead oxide and are deposited in a layer using methods known in the digital radiographic, photo-lithographic, and integrated circuit arts, for example evaporation, sputtering, or coating. The materials are doped, for example selenium is doped with arsenic and can form an alloy.

In a further embodiment of the present invention shown in FIG. 1, a common electrode 50 is formed over the radiation-sensitive layer 40. The common electrode 50 can extend over much of the first substrate 10 and is co-extensive with the pixel electrodes 30. By applying an electrical bias between the common electrode 50 and the pixel electrodes 30, charge is moved or a current conducted to one or the other of the common or pixel electrodes 50 or 30 to form an electrical signal for each pixel electrode 30 that is conducted through the pixel connection pads 22 to the electronic circuits 26. The common electrode 50 is electrically connected to an electronic control circuit 80 (FIG. 3) or to the integrated circuits 20 (not shown). A protective layer 60 is optionally formed over the common electrode 50 to protect the various layers formed on the first substrate 10.

Both the common electrode 50 and the pixel electrode 30 can comprise electrically conductive materials known in the art such as metal (e.g. aluminum, silver, gold), metal alloy, metal oxide (e.g. indium tin oxide, zinc aluminum oxide, tin oxide) or other conductors including inorganic or organic materials (e.g. carbon, carbon nanotubes in a binding layer, and polythiophene). Deposition methods for the various materials (e.g. vapor deposition, sputtering, or coating) are known in the art. The common electrode 50 is transparent to the incident radiation if the radiation-sensitive layer 40 is exposed through the common electrode 50. If it is not, then the common electrode 50 is optionally opaque to the incident radiation. Similarly, the pixel electrodes 30 is transparent to the incident radiation if the radiation-sensitive layer 40 is exposed through the pixel electrodes 30. If it is not, then the pixel electrodes 30 is optionally opaque to the incident radiation.

Referring to the schematic of FIG. 3, the radiation-sensitive apparatus 5 has an electronic control circuit 80 that is electrically connected to each electronic circuit 26 (FIG. 2) in each integrated circuit 20 through electrical connectors 32 (e.g. wires formed on or over the first substrate 10 or layers on the first substrate 10) and control connection pads 28. The electronic circuits 26 (FIG. 2) are responsive to electrical signals formed by the interaction of electromagnetic radiation and the radiation-sensitive layer 40 (FIG. 1), the electrical signals conducted by the pixel electrodes 30 and pixel connection pads 22. The pixel electrodes 30 are electrically connected to pixel connection pads 22 through pixel connection wires 34, as needed for a desired first substrate 10 layout. As shown in FIG. 3, pixels 70 are defined by the extent of each pixel electrode 30 in combination with the common electrode 50. The common electrode 50 can also be connected to the electronic control circuit 80.

The radiation-sensitive layer 40 of FIG. 1 is exposed to patterned radiation either through the layers 60 and 50, or through the first substrate 10 and pixel electrode layer 30. However, if the incident radiation travels through the first substrate 10 and pixel electrode layer 30, the radiation is obstructed by the integrated circuits 20. Furthermore, in the embodiment of FIG. 1, the integrated circuits 20 are located in a layer between the first substrate 10 and the pixel electrodes 30, and the pixel electrodes 30 are located between the radiation-sensitive layer 40 and the integrated circuits 20. Thus, in this embodiment, it is necessary to form the pixel and common electrode layers 30, 50, and radiation-sensitive layer 40 over the integrated circuits 20 on a side of the integrated circuits 20 opposite the active substrate 10. Since the integrated circuits 20 can be relatively thick compared to the radiation-sensitive layer 40, pixel electrode 30, and common electrode 50, forming continuous layers over the integrated circuits 20 can be difficult. Moreover, the mechanisms by which the integrated circuits 20 are located over the first substrate 10 can cause contamination, such as unwanted particles, in the various layers.

Therefore, in an alternative embodiment of the present invention illustrated in FIG. 4, the radiation-sensitive apparatus 5 has a radiation-sensitive layer 40 located between the integrated circuits 20 and the first substrate 10 and the pixel electrodes 30 are located between the radiation-sensitive layer 40 and the integrated circuits 20. As shown in FIG. 4, the common electrode layer 50 is formed on the active side 11 of the first substrate 10. The radiation-sensitive layer 40 is formed over the common electrode layer 50 and the patterned pixel electrodes 30 formed over the radiation-sensitive layer 40 and electrically separated by insulators 15 to define pixels 70. Integrated circuits 20 are located over the pixel electrodes 30, in this case with the pixel and control connection pads 22, (and 28, not shown) facing the first substrate 10 and the pixel electrodes 30. The pixel and control connection pads 22, 28 are electrically connected to the pixel electrodes 30 and electrical connectors 32 (not shown in FIG. 4). Suitable materials for enabling the electrical connection between the pixel and control connection pads 22, (and 28, not shown) and the pixel electrodes 30 and electrical connectors 32 (not shown) include solder balls and anisotropic conducting materials. Such materials and their application and curing are known in the printed circuit board industry. An encapsulating and insulating layer 14 can be formed (e.g. by coating) over the integrated circuits 20 and a protective layer 60 coated over the entire device.

This structure has the advantages of locating the integrated circuits 20 over the layers (e.g. 30, 40, 50) so that the layers are more planar. Furthermore, by positioning the integrated circuits 20 with the connection pads 22 (and 28, not shown) facing towards the first substrate 10, photolithographic steps are avoided since the connection pads 22 (and 28, not shown) are directly connected to the electrical connections 32 (not shown), pixel connection wires 34 (not shown), or pixel electrodes 30. As noted above with respect to FIG. 1, radiation 8 is incident upon the radiation-sensitive layer 40 either through the first substrate 10 or the protective layer 60, but in the latter case is obstructed by the integrated circuits 20.

Figure 5:
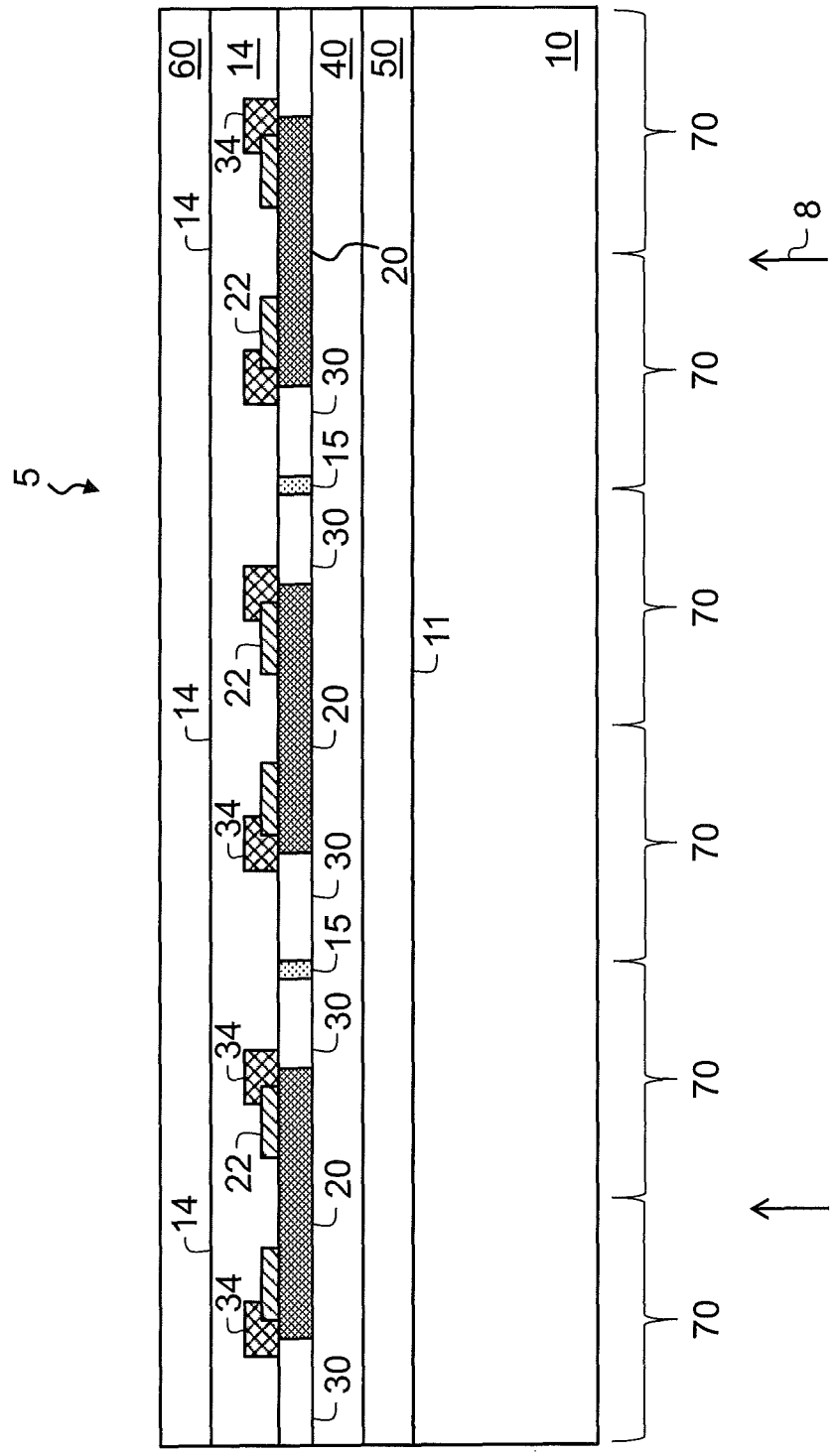
FIG. 5 is a cross section of an alternative bottom-detecting radiation-sensitive apparatus according to another embodiment of the present invention.

In yet another radiation-sensitive apparatus 5 example, illustrated in FIG. 5, the integrated circuits 20 and the pixel electrodes 30 defining pixels 70 are formed in a common layer over the first substrate 10 active side 11, for example on the radiation-sensitive layer 40. The pixel electrodes 30 are insulated from each other by insulators 15 and covered with an encapsulating and insulating layer 14 and protective layer 60. A common electrode 50 is formed on the first substrate 10. This structure can be irradiated with radiation 8 from either the protective layer 60 side or the first substrate side 10, but requires pixel connection wires 34 to electrically connect the pixel connection pads 22 to the pixel electrodes 30 (and the control connection pads 28 to the electrical connectors 32, not shown in FIG. 5).

In both the embodiments of FIGS. 4 and 5, an additional adhesive layer (12 in FIG. 1, not shown in FIGS. 4 and 5) is used to adhere layers to the first substrate 10, if needed. Alternatively, the first substrate 10 is treated (e.g. by chemical processes or by additional coated layers) to improve the adhesion of subsequently deposited layers such as the common electrode 50, the radiation-sensitive layer 40, or the pixel electrode layer 30.

Figure 6:
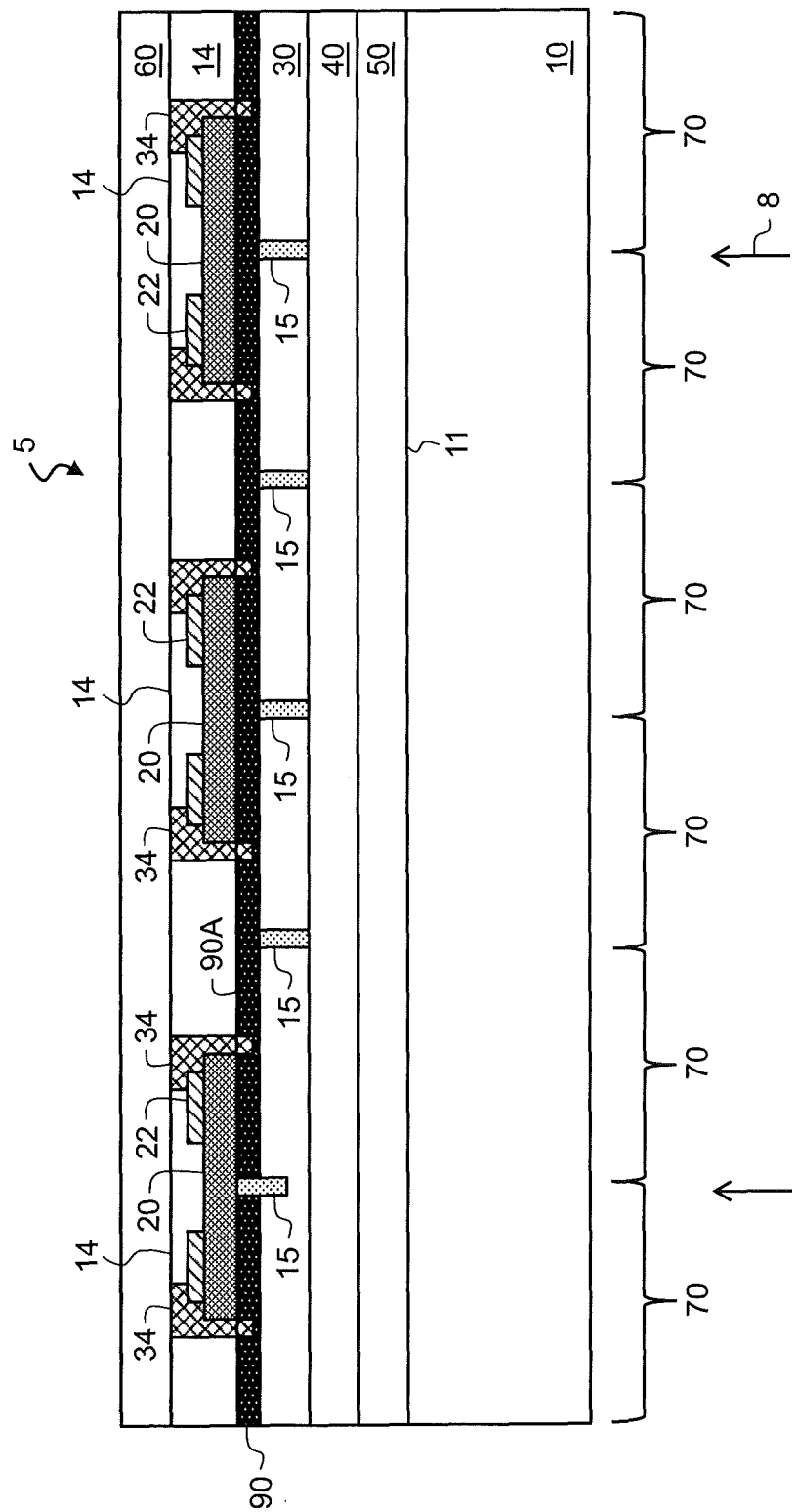
FIG. 6 is a cross section of an alternative bottom-detecting radiation-sensitive apparatus having a protective layer according to yet another embodiment of the present invention.
Figure 7:
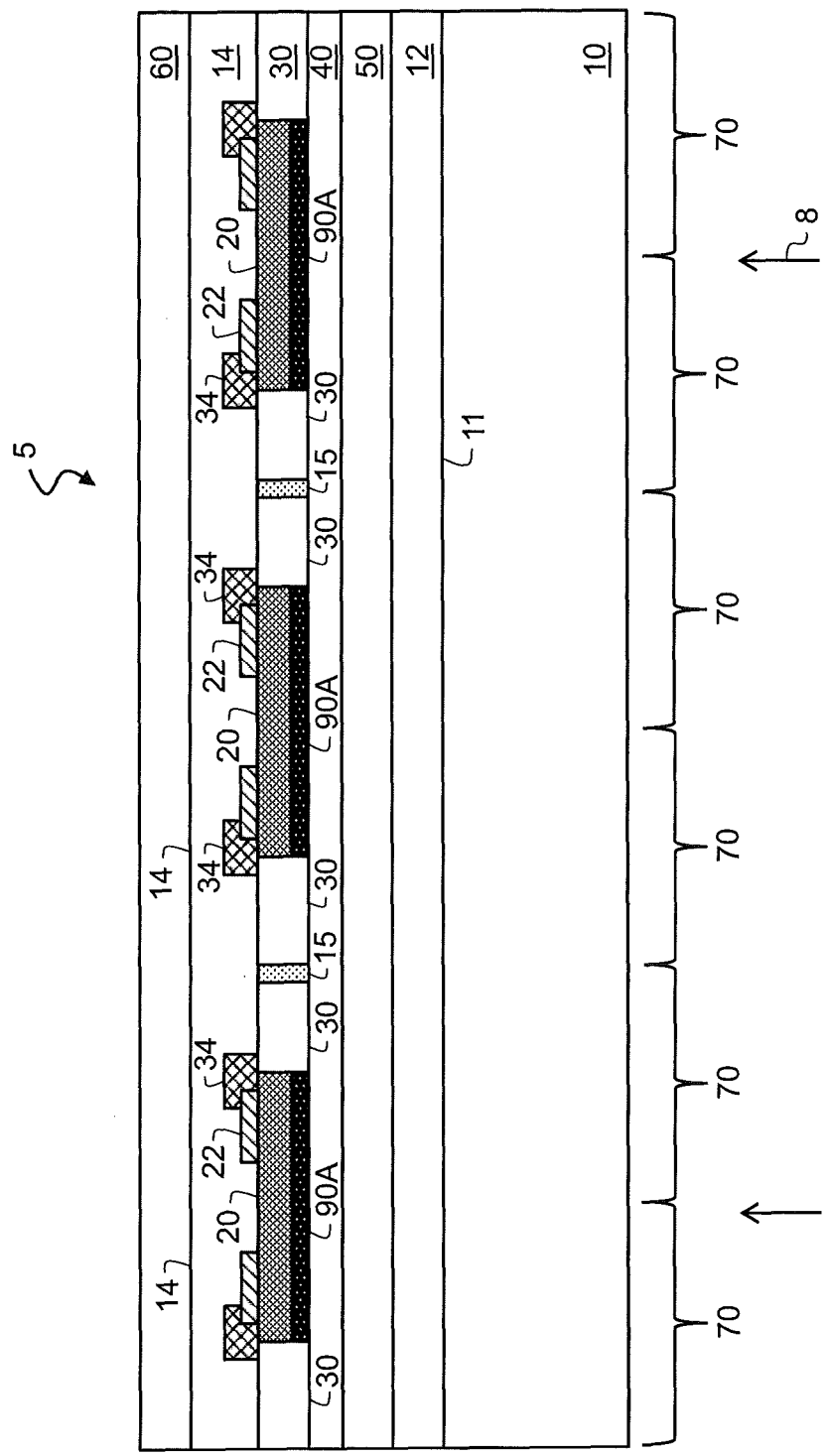
FIG. 7 is a cross section of an alternative bottom-detecting radiation-sensitive apparatus having protective elements according to another embodiment of the present invention.

Referring to FIGS. 6 and 7, in an additional embodiment of the present invention, shielding layers 90 (FIG. 6) or elements 90A (FIG. 7) are provided to prevent irradiation of layers or portions of layers in the radiation-sensitive apparatus 5. Referring to FIG. 6, a layer 90 of a radiation-absorbing or opaque material, such as a metal is deposited over the radiation-sensitive layer 40 so that radiation incident on the radiation-sensitive layer 40 from the integrated circuit 20 and pixel connection pad 22 side of the apparatus 5 is greatly reduced. The first substrate 10 active side 11 has a common electrode 50, a radiation-sensitive layer 40 and pixel electrodes 30 defining pixels 70 separated by insulators 15 formed thereon. A shielding layer 90 separates the pixel electrodes 30 from the integrated circuits 20, except for pixel connection wires 34 conducting electrical signals through vias in the shielding layer 90. Electrical connectors 32 (not shown) connected to control connection pads 28 (not shown) can be formed over the encapsulation and insulating layer 14, and a protective layer 60 formed over the encapsulation and insulating layer 14. Known photo-lithographic processes can be used to form the various layers and structures using known materials described above. In FIG. 7, the shielding layer is reduced to shielding elements 90A protecting the integrated circuits 20 from incident radiation 8 passing through the first substrate 10. The shielding elements 90A are formed in a layer but the layer is not continuous and includes openings between the shielding elements 90A.

While the shielding layer 90 and shielding elements 90A are shown in FIGS. 6 and 7 between the pixel electrode layer 30 and the encapsulating and insulating layer 14, in other embodiments (not shown), shielding layers 90 can instead, or in addition, be located over or under the protective layer 60 or on either side of the first substrate 10 to control incident radiation exposure of the various layers. For example, the incidence of ambient light onto semiconductor materials can be deleterious to the electrical signals, since spurious electrical charges can be generated that increase noise in the electrical signals. FIG. 6 locates the pixel electrodes 30 between the integrated circuits 20 and the radiation-sensitive layer 40 while FIG. 7 locates the pixel electrodes 30 between the integrated circuits 20 in a common layer.

In various embodiments of the present invention, the integrated circuits 20 and the electrical signals are controlled in a variety of different ways. In the embodiments illustrated in FIGS. 1 and 3, for example, each pixel electrode 30 is independently electrically connected to a different pixel connection pad 22 on an integrated circuit 20 through a pixel connection wire 34. Each pixel electrode 30 is electrically insulated from other pixel electrodes 30 and produces a separate electrical signal that is connected to an electronic circuit 26 (FIG. 2) in the integrated circuit 20. Each pixel electrode 30 is connected to a separate, identical electronic circuit 26 (not shown) that is then connected to a communications circuit for transmission to a electrical control circuit 80 through electrical connection wires 32. In this embodiment, each pixel electrode 30 has its own electronic circuit. Such active-matrix control circuits are known in the art.

Figure 8:
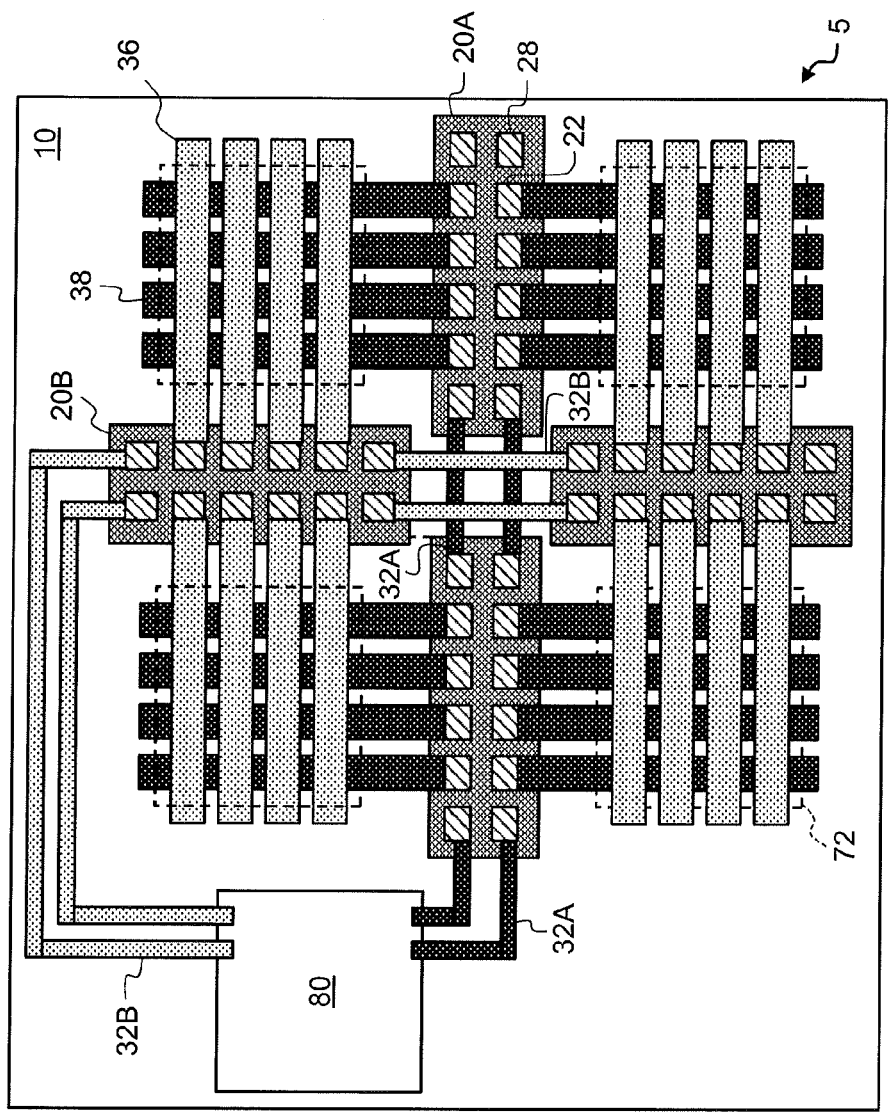
FIG. 8 is a schematic of a radiation-sensitive apparatus according to another embodiment of the present invention.
Figure 9:
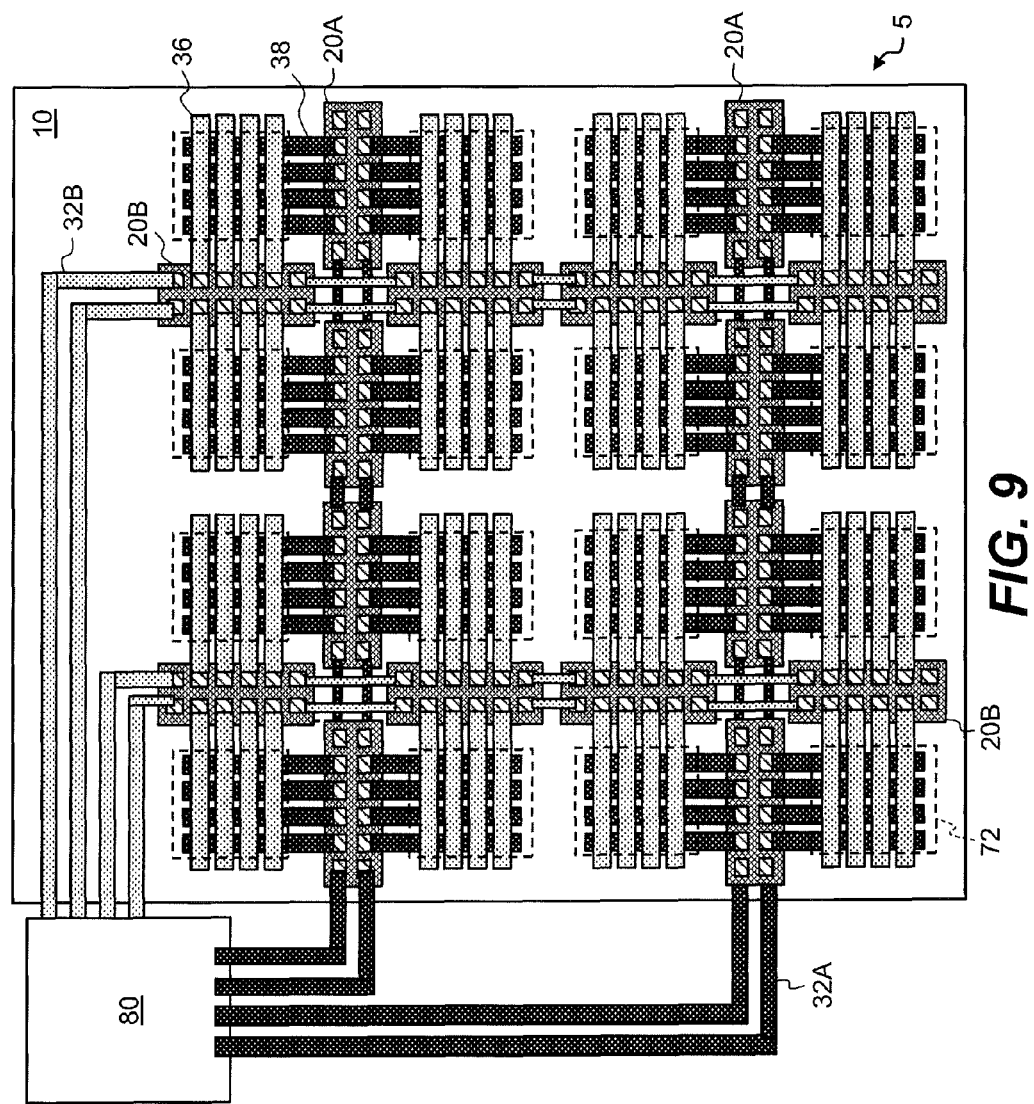
FIG. 9 is a schematic of a radiation-sensitive apparatus according to another embodiment of the present invention.

In an alternative embodiment illustrated in FIGS. 8 and 9, groups 72 of pixels are controlled together and share electrodes. The pixels are defined by the overlap of pixel electrodes 36 extending in a first direction and common electrodes 38 extending in a second direction different from the first direction formed on a side of the radiation-sensitive layer 40 (not shown) opposite the pixel electrodes 36. Pixel electrodes 36 correspond to row electrodes and common electrodes 38 correspond to column electrodes. Each common electrode 38 is connected to a different connection pad 22 and each pixel electrode 36 is connected to a different connection pad 22. Each common electrode 38 defines a plurality of pixels in combination with a corresponding plurality of pixel electrodes 36. Likewise, each pixel electrode 36 defines a plurality of pixels in combination with a corresponding plurality of common electrodes 38, forming an array of pixels. The electronic circuits 26 (not shown) control the common electrodes 38 and pixel electrodes 36 to provide an electrical bias across each pixel and the electronic circuits 26 (not shown) receive the electrical signals from the common electrodes 38 and the pixel electrodes 36. Electronic circuits 26 (not shown) that provide such passive-matrix control circuits are known in the art. Integrated circuits 20A can include the electronic circuits 26 (not shown) connected to the common electrodes 38 and integrated circuits 20B can include the electronic circuits 26 connected to the pixel electrodes 36. Alternatively, the electronic circuits 26 controlling the pixels in a group 72 can be formed in a single integrated circuit 20 (not shown) or are divided between different portions of different integrated circuits 20 (not shown).

In a further embodiment of the present invention, control connection pads 28 in integrated circuits 20A located in a row over the first substrate 10 are connected through row control connectors 32A (e.g. electrical wires) to the electronic control circuit 80. Control connection pads 28 in integrated circuits 20B located in a column over the first substrate 10 are connected through column control connectors 32B (e.g. electrical wires) to the electronic control circuit 80. Electronic control circuit 80 can provide passive-matrix control using circuits and methods well-known in the art. The use of the terms "row" and "column" herein are arbitrary and intended to denote structures formed in different directions (e.g. first and second directions). FIG. 9 illustrates a larger passive-matrix-controlled structure corresponding to FIG. 8. The number of pixels within a group 72 of pixels in each dimension is constrained by the number of pixel connection pads 22 on an integrated circuit 20. The larger the integrated circuits 20, the more pixel connection pads 22 can be formed in the integrated circuits 20 and the larger the array of pixels formed in the group 72. Multiple row or column integrated circuits 20A or 20B can control a single group 72 of pixels.

Figure 10:
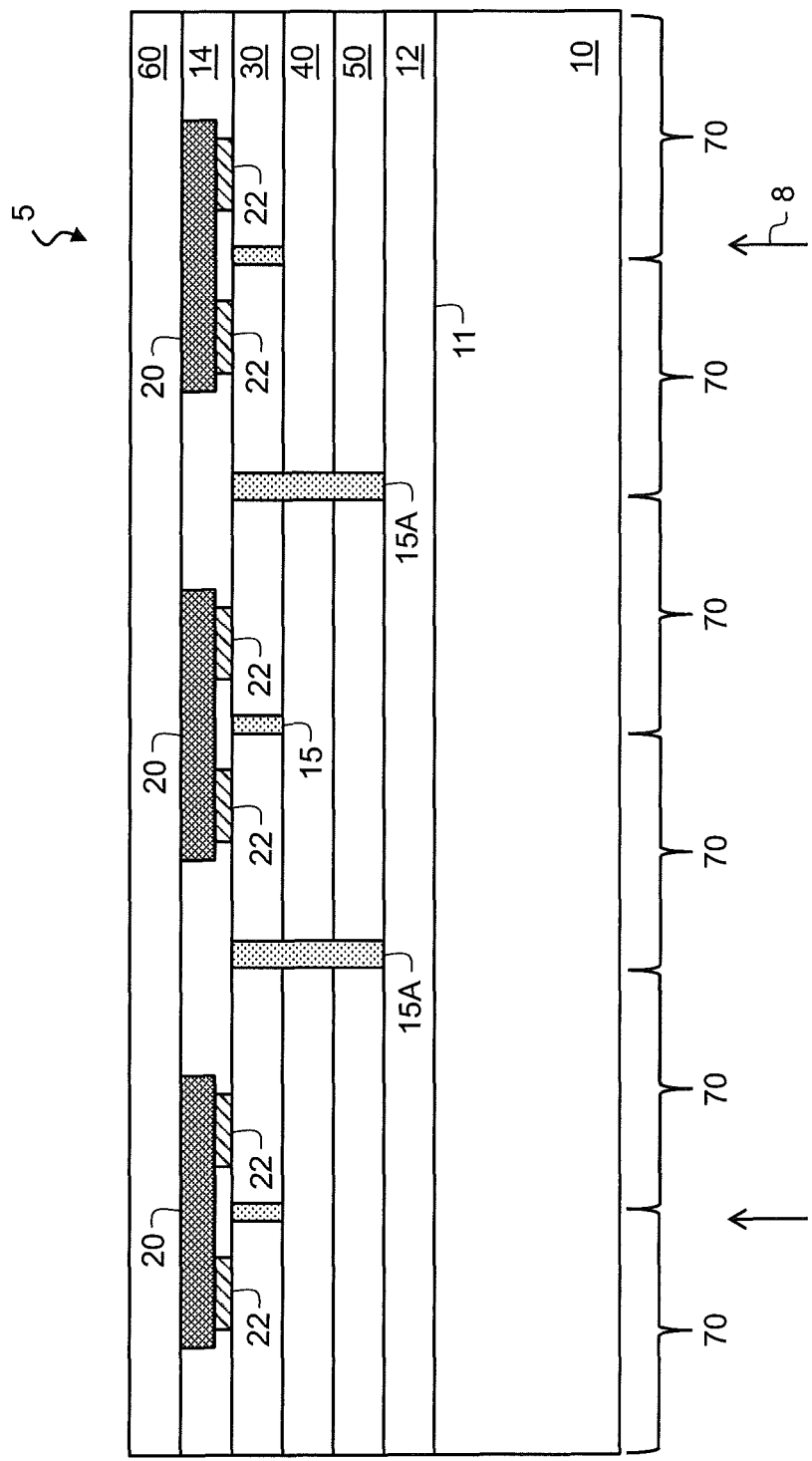
FIG. 10 is a cross section of a radiation-sensitive apparatus having segmented portions according to another embodiment of the present invention.
Figure 13B:
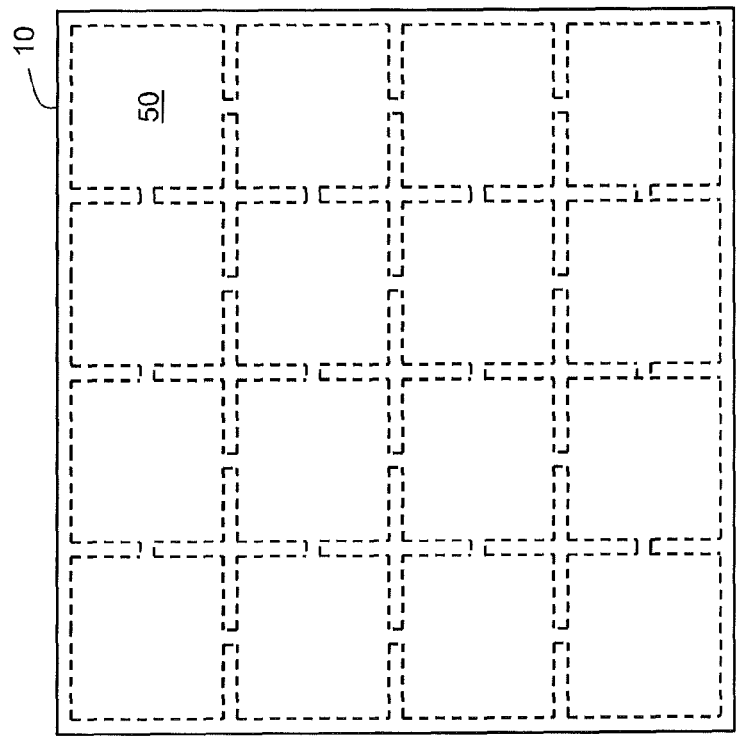
FIG. 13B is a plan view of a common electrode formed on the active side of the first substrate with two-dimensional segmented portions useful for understanding an embodiment of the present invention.
Figure 13A:
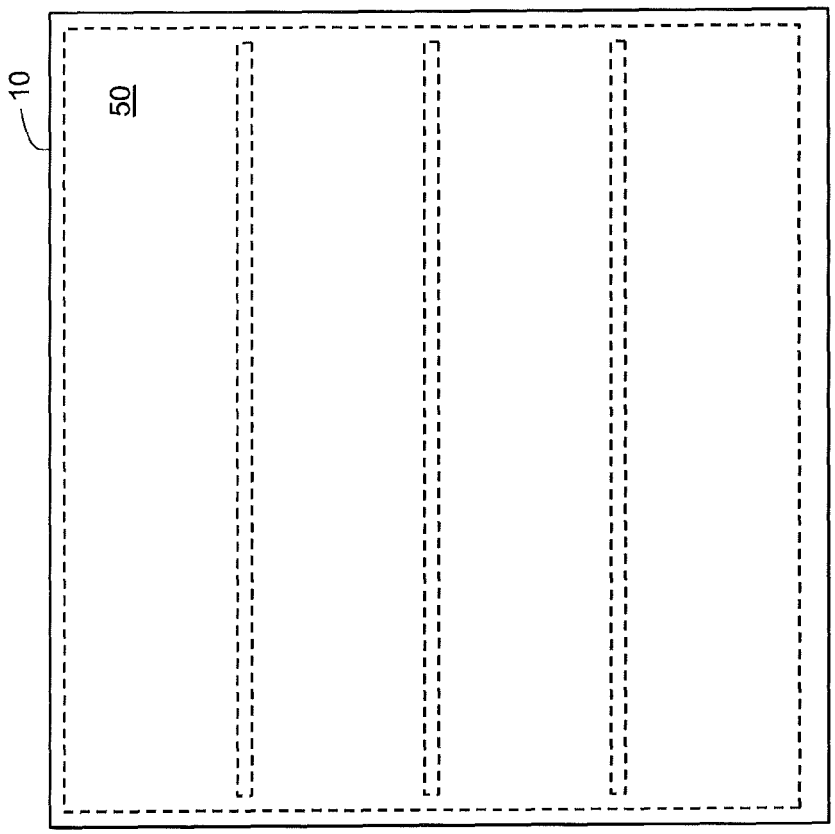
FIG. 13A is a plan view of a common electrode formed on the active side of the first substrate with segmented portions in a horizontal direction useful for understanding an embodiment of the present invention.

The first substrate 10 is rigid (for example made of relatively thick glass, metal or ceramic) or flexible (for example made of relatively thin glass, plastic, or metal foil). If the first substrate 10 is flexible, it is useful to have similarly flexible layers in the other layers of the various embodiments of the present invention to provide a flexible radiations-sensitive apparatus 5. Referring to FIG. 10, in a further embodiment of the present invention, the radiation-sensitive layer 40 is segmented into spatially separate portions by insulators 15A. The insulators 15A can have different mechanical attributes, for example greater flexibility or a reduced likelihood of cracking under stress so that if the radiation-sensitive layer 40 is stressed by bending the first substrate 10, the stress is applied to the insulators 15A to a greater degree than to the radiation-sensitive layer 40 materials, reducing the likelihood of cracking the radiation-sensitive layer 40 materials. Similarly, the pixel electrodes 30 are separated with such an insulator 15A as can the common electrode 50 to reduce stress in the materials forming the layers. However, as shown in FIGS. 13A in a one-dimensional case and 13B in a two-dimensional case, the common electrode 50 is electrically common so that each of the spatially separate portions are actually connected, for example at the edges or with small vias between portions. In another embodiment of the present invention, the connecting portions of the common electrode 50 can include different materials that are more stress resistant than the other portions of the common electrode 50, thus reducing the likelihood of cracking.

In an embodiment, the separate portions are formed between the integrated circuits 20, so that the stress is located preferentially between the integrated circuits 20. Alternatively, separate portions are formed in alignment with the integrated circuits 20, so that the stress is located preferentially in the integrated circuits 20. Thin layers of crystalline semiconductor material, e.g. silicon, can bend and it can also bend the layers in the spatial location of the integrated circuit 20 than elsewhere in the layer structure. For example, it is known that metal oxides used as electrodes are prone to cracking under stress, and it is preferred to reduce the stress in the locations of the electrodes.

In either the embodiment of FIG. 3 or the embodiment of FIGS. 8 and 9, the pixels can form a two-dimensional array capable of representing the patterns formed by incident patterned radiation, for example from a diagnostic x-ray or other radiation. Depending on the materials employed in the radiation-sensitive layer 40, the electrical signal is a current or a charge.

Figure 14:
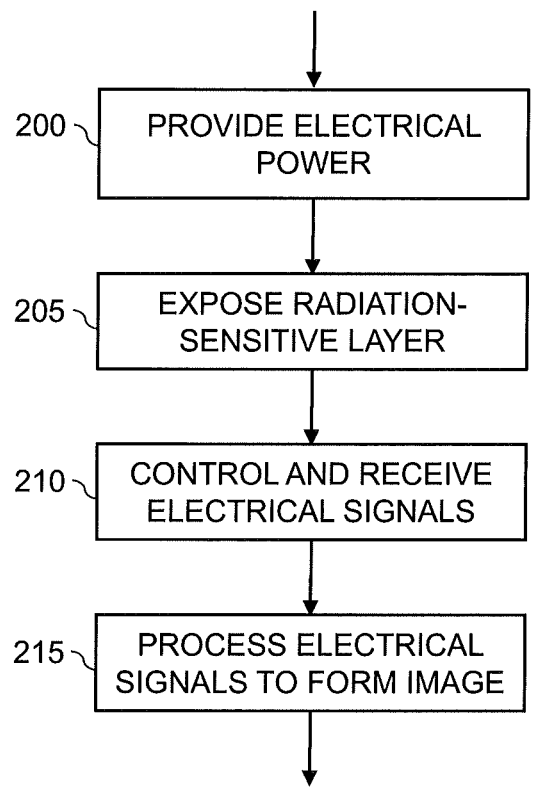
FIG. 14 is a flow graph illustrating an embodiment of the present invention.

The present invention can be used to provide medically diagnostic information. According to a method of the present invention illustrated in FIG. 14, electrical power is provided to the integrated circuits 20 and electronic control circuit 80 in step 200. A radiation source is provided and the object (e.g. a patient) is located with respect to the radiation source so that the radiation passes through the object forming patterned radiation 8 (e.g. by differentially absorbing the radiation) that impinges on the radiation-sensitive layer 40 to expose the radiation-sensitive layer 40 to the patterned radiation 8 in step 205, forming electrical signals in the radiation-sensitive layer 40. The electronic circuits 26 control and receive the electrical signals which are then communicated to the electronic control circuit 80 in step 210. The electrical signals are processed to form an image representative of the patterned radiation in step 215. The processing can be done in the electronic control circuit 80 or in an image processor, such as a computer, as is known in the image processing arts. The resulting image can then be displayed, for example, on a large, flat-panel display, viewed by a diagnostician such as a radiologist, and a diagnosis made from the image.

Figures 11, 12:
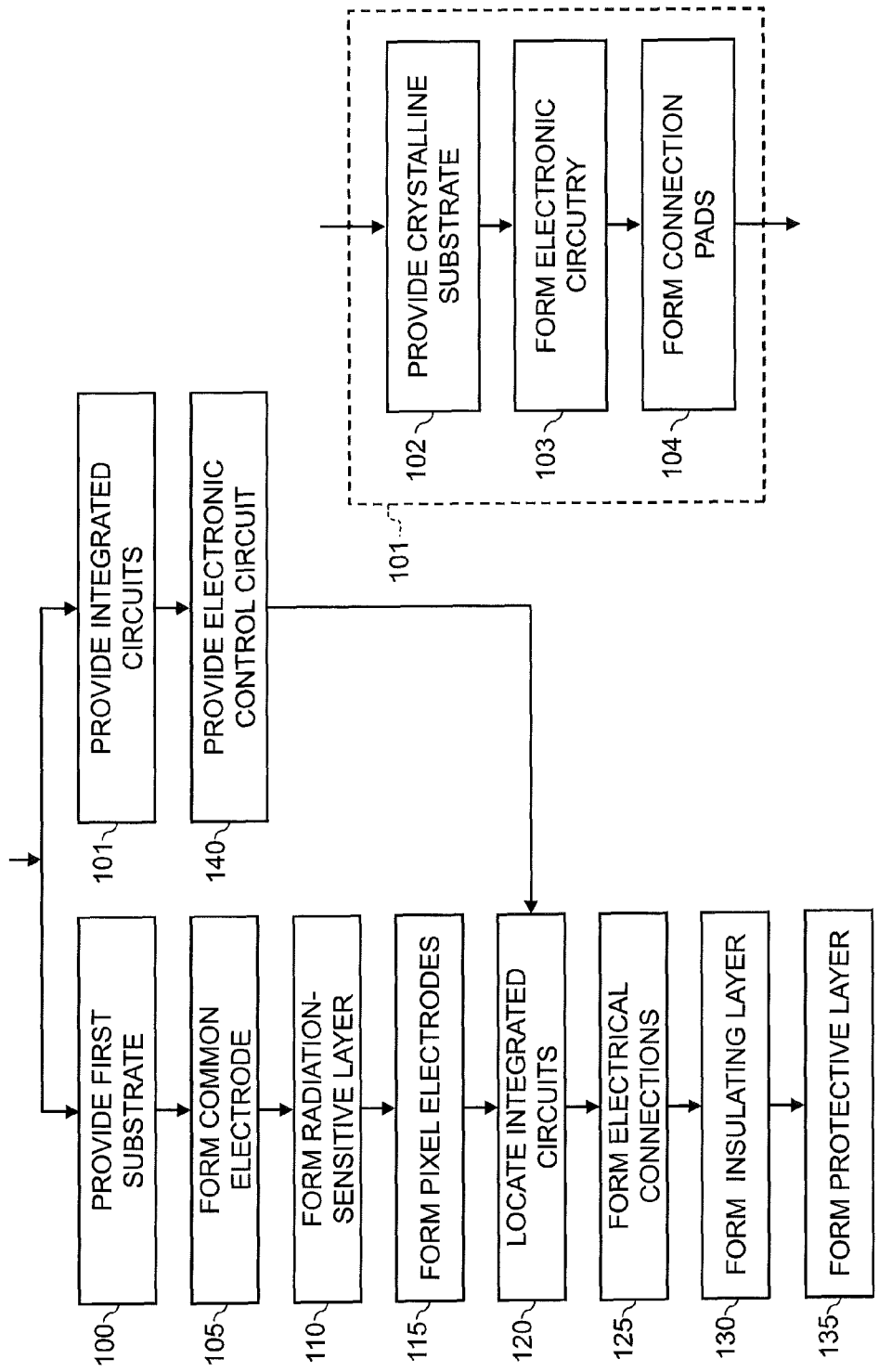
FIG. 11 is a flow graph illustrating an embodiment of the present invention.
FIG. 12 is a flow graph detail of a portion of FIG. 11 illustrating an embodiment of the present invention.

Referring to FIG. 11 and FIG. 4, a method of making a radiation-sensitive apparatus, includes providing a first substrate 10 having an active side 11 in step 100. An optional adhesive layer or treatment is provided on the active side and a common electrode 50 is formed on the active side 11 in step 105. A radiation-sensitive layer 40 is formed over the active side 11 of the first substrate 10 in step 110, and is formed on the common electrode 50. A plurality of pixel electrodes 30 is formed over the active side 11 of the first substrate 10, for example on the radiation-sensitive layer 40, in step 115. The common electrode 50, radiation-sensitive layer 40, and pixel electrodes 30 are formed, for example, by evaporative deposition, sputtering, or coating sequential layers of materials. The pixel electrodes 30 can be patterned using known photolithographic methods.

A plurality of spatially separated integrated circuits is provided (step 101) and located on the active side in step 120. The integrated circuits 20 are made using integrated circuit fabrication processes known in the integrated circuit art. Each integrated circuit 20 includes a second individual substrate different and separate from the first substrate 10, one or more electronic circuit(s) formed in or on the second substrate, and one or more pixel electrode connection pads 22 formed in or on the second substrate, each pixel electrode connection pad 22 electrically connected to at least one of the electronic circuit(s). The pixel electrodes 30 are separate from the integrated circuits 20 and each pixel electrode 30 is electrically connected to a pixel electrode connection pad 22, for example by using metal deposition and patterning methods known in the photo-lithographic arts to form pixel connection wires 34 in step 125. An electronic control circuit 80 is provided (step 140) and electrically connected to each electronic circuit 26 in each integrated circuit 20, for example by forming electrical connectors 32 (e.g. metal wires) electrically connecting the control connection pads 28 (not shown in FIG. 4) and the electronic control circuit 80 (FIG. 3, step 125).

Referring also to FIG. 12, the integrated circuits 20 are provided (step 101) in a process separate from that to the radiation-sensitive apparatus 5 by using methods known in the integrated circuit fabrication arts. For example, as shown in FIG. 12, a semiconductor substrate, e.g. a crystalline silicon substrate, are provided in step 102, photo-lithographic processes employed to form electronic circuits in step 103, and connection pads, 22, 28 for example made of patterned metal or silicon, formed on the integrated circuit in step 104. Other connection structures known in the art (for example metal extrusions) compatible with electrical interconnections used in the structure of the present invention can be used.

The integrated circuits 20 are located using various methods known in the art, for example by picking and placing pre-made integrated circuits from a source substrate using adhesive or vacuum methods. The electrical connections from the connection pads (e.g. 22, 28) on the integrated circuit 20 can be made by depositing and patterning metal directly on the connection pads (22, 28) and connecting wires (e.g. 32, 34) using photo-lithography or through solder reflow methods or with anisotropic conductive materials.

An encapsulation and insulating layer 14 is formed over the integrated circuits 20 in step 130 of FIG. 11. The encapsulation and insulating layer 14 can be patterned if needed using conventional photo-lithographic processes to enable electrical connections between the connection pads (22, 28) and pixel connection wires 34, electrical connections 32, or pixel electrodes 30. A protective layer 60 formed in step 135 can provide environmental robustness.

FIGS. 1 and 5 illustrate alternative embodiments of the present invention. In these cases, the order of layer deposition and patterning is different. For example, in the example of FIG. 1, the integrated circuits 20 are located (step 120) and patterned structures (e.g. vias) provided before the pixel electrodes 30 are formed (step 115), followed by the radiation-sensitive layer 40 (step 110) and common electrode 50 (step 105). In the example of FIG. 5, the steps of FIG. 4 are replicated except that the encapsulating and insulating layer 14 is patterned differently to provide electrical connections between the connection pads (22, 28), the pixel electrodes 30, and the electrical control circuit 80 (not shown). Pixel electrodes 30 and integrated circuits 20 can be located in a common layer in a structure similar to that of FIG. 1, as well as the illustrated structure of FIG. 5 that is similar to FIG. 4.

A protective layer 60 can also be formed over the various layers in step 135 to protect the device.

In an embodiment, the electronic control circuit 80 is an integrated circuit mounted on the first substrate 10 or mounted externally to the first substrate 10 and electrically connected through an electrical connector 32, using methods well-known in the printed-circuit-board arts. The electronic circuits 26 are responsive to electrical signals formed by the interaction of electromagnetic radiation and the radiation-sensitive layer 40. The electrical signals are conducted by the pixel electrodes 30 through the pixel connection wires 34 (if present) and the pixel connection pads 22 to the electronic circuits 26. The electronic circuits 26 then transmit the electrical signals through the control connection pads 28 (not shown) and electrical connectors 32 to the electronic control circuit 80.

In various other methods of the present invention, a single common electrode co-extensive with the pixel electrodes 30 is formed on or over the active side 11 of the first substrate 10. Pixel electrodes 30 and the integrated circuits 20 are formed in a common layer.

The integrated circuits 20 are located in a layer between the first substrate 10 and the pixel electrodes 30, and the pixel electrodes 30 are located between the radiation-sensitive layer 40 and the integrated circuits 20. In this method, a single common electrode 38, 50 is located co-extensive with the pixel electrodes 30 over the radiation-sensitive layer 40. Alternatively, the pixel electrodes 30 and the integrated circuits 20 are located in a common layer.

In yet another alternative method, the radiation-sensitive layer 40 is located between the integrated circuits 20 and the first substrate 10 and the pixel electrodes 30 are located between the radiation-sensitive layer 40 and the integrated circuits 20. In this structure, the single common electrode 38, 50 is located co-extensive with the pixel electrodes 30 between the radiation-sensitive layer 40 and the first substrate 10.

In another method, a shielding layer 90 is located between the radiation-sensitive layer 40 and the integrated circuit 20 layer or shielding elements 90A are formed between each integrated circuit 20 and the radiation-sensitive layer 40.

In one method of forming control circuits for the radiation-sensitive apparatus 5, each pixel electrode 30 is independently electrically connected to a single connection pad 22, 28.

In another method of controlling radiation-sensitive apparatus 5, an array of pixel electrodes 30 is formed extending in a first direction on a side of the radiation-sensitive layer 40 opposite the common electrodes 38, 50. The pixel electrodes 30 are formed to extend in a second direction different from the first direction and overlap with the common electrodes 38, 50 to define pixels 70. Each common electrode 38, 50 and each pixel electrode 30 is connected to a different connection pad 22, 28. The electronic control circuits 80 are formed to control the common electrodes 38, 50 and pixel electrodes 30 to provide an electrical bias in each pixel 70 and the electronic control circuits 80 are formed to receive the electrical signals from the common electrodes 38, 50 and the pixel electrodes 30.

In further methods of the present invention, arrays of pixel electrodes 30 and common electrodes 38, 50 are provided to define pixel groups 72 and each group is controlled by a different one or more integrated circuits 20. The integrated circuits 20 are electrically connected to provide electrical signal communication from the integrated circuits 20 to a controller. In another embodiment, the integrated circuits 20 are formed into groups that are serially connected to the electronic control circuit 80. The integrated circuits 20 can correspond to row and column control elements that are electrically connected with row and column control electrodes to the electronic control circuit 80.

In another method, the radiation-sensitive layer 40, the common electrode 38, 50, or the pixel electrode 30 layer is segmented into spatially separate portions. The separations are made between the integrated circuits 20 or are made in locations that are directly above or below the integrated circuits 20.

In other methods, the pixel electrodes 30 are formed in a two-dimensional array and provide electrical signals that are current or charge signals. In one method, the electronic circuits are provided in a crystalline semiconductor integrated circuit.

In another embodiment, a method of using a radiation-sensitive apparatus 5 made as described above includes providing electrical power to the integrated circuits 20 and electronic control circuit 80 exposing the radiation-sensitive layer 40 to patterned radiation, using the electronic control circuit 80 to receive the electrical signals from the integrated circuit 20, and processing the electrical signals to form an image representative of the patterned radiation.

The present invention provides advantages over methods and structures known in the prior art. By providing circuits made independently of the first substrate, crystalline semiconductors having higher performance (improved speed and lower noise) than organic or thin-film circuits can be used to improve the sensitivity and quality of the acquired image signals. Furthermore, processing conditions and substrate material requirements are less stringent, leading to lower cost and higher yields in materials and processing. Processing resolutions are reduced since the first substrate and layers can be made in processes that have a lower resolution than those employed in making electronic devices in an integrated circuit. Larger substrates can be used at a lower cost, increasing the size of the acquired images and improving their diagnostic capability and usefulness. Because the integrated circuits are inorganic and can be packaged or encapsulated, the processing conditions used to form the various layers of the apparatus can be more rigorous (e.g. higher heat, more potent chemicals). Flexible substrates are more readily employed.

The present invention can be employed in radiographic systems. In particular, the present invention can be practiced with x-ray diagnostic equipment.

The invention has been described in detail with particular reference to certain preferred embodiments thereof, but it should be understood that variations and modifications can be effected within the spirit and scope of the invention.

Parts List

D distance
5 radiation-sensitive apparatus
8 radiation
10 first substrate
11 active side
12 adhesive layer
14 encapsulating and insulating layer
15, 15A insulator
20 integrated circuit
20A integrated circuit
20B integrated circuit
22 pixel connection pad
24 second substrate
26 electronic circuits
28 control connection pad
30 pixel electrode
32 electrical connector
32A row control connector
32B column control connector
34 pixel connection wire
36 pixel electrode
38 common electrode
40 radiation-sensitive layer
50 common electrode
60 protective layer
70 pixel
72 pixel group
80 electronic control circuit
90 shielding layer
90A element
100 provide first substrate step
Parts List (Con't)
101 provide integrated circuits step
102 provide crystalline substrate step
103 form electronic circuits step
104 form connection pads step
105 form common electrode step
110 form radiation-sensitive layer step
115 form pixel electrodes step
120 locate integrated circuits step
125 form electrical connections step
130 form insulating and encapsulating layer step
135 form protective layer step
140 provide electronic circuit control step
200 provide electrical power step
205 expose radiation-sensitive layer step
210 control and receive electrical signals step
215 process electrical signals to form image step

The invention claimed is:

1. A method of making a radiation-sensitive apparatus, comprises:
   providing a first substrate having an active side;
   forming a radiation-sensitive layer over the active side of the first substrate;
   providing a plurality of spatially separated integrated circuits, each integrated circuit having:
      a second individual substrate different and separate from the first substrate;
      one or more electronic circuit(s) formed in or on the second substrate; and
      one or more electrode connection pads formed in or on the second substrate, each electrode connection pad electrically connected to at least one of the electronic circuit(s);
   adhering the plurality of spatially separated integrated circuits to the active side of the first substrate:
   forming a plurality of pixel electrodes over the active side of the first substrate separate from the integrated circuit, each pixel electrode electrically connected to an electrode connection pad;
   providing an electronic control circuit electrically connected to each electronic circuits in each integrated circuit; and wherein
   the electronic circuits are responsive to electrical signals formed by the interaction of electromagnetic radiation and the radiation-sensitive layer, the electrical signals conducted by the pixel electrodes and electrode connection pads.

2. The method of claim 1, further including forming a single common electrode co-extensive with the pixel electrodes on or over the active side of the first substrate.

3. The method of claim 1, further including locating the integrated circuits in a layer between the first substrate and the pixel electrodes, and locating the pixel electrodes between the radiation-sensitive layer and the integrated circuits.

4. The method of claim 3, further including forming a single common electrode co-extensive with the pixel electrodes over the radiation-sensitive layer.

5. The method of claim 1, further including locating the pixel electrodes and the integrated circuits in a common layer.

6. The method of claim 1, further including locating the radiation-sensitive layer between the integrated circuits and the first substrate and locating the pixel electrodes between the radiation-sensitive layer and the integrated circuits.

7. The method of claim 6, further including forming a single common electrode co-extensive with the pixel electrodes between the radiation-sensitive layer and the first substrate.

8. The method of claim 1, further including providing a shielding layer located between the radiation-sensitive layer and the integrated circuit layer.

9. The method of claim 8, further including forming a shielding element between each integrated circuit and the radiation-sensitive layer.

10. The method of claim 1, further including independently electrically connecting each pixel electrode to a single connection pad.

11. The method of claim 1, further including forming an array of common electrodes extending in a first direction on a side of the radiation-sensitive layer opposite the pixel electrodes; and wherein
   i) the pixel electrodes extend in a second direction different from the first direction and overlap to define pixels;
   ii) each common electrode and each pixel electrode is connected to a different connection pad; and wherein
   iii) the electronic circuits control the common electrodes and pixel electrodes to provide an electrical bias in each pixel; and
   iv) the electronic circuits receive the electrical signals from the common electrodes and the pixel electrodes.

12. The method of claim 11, further including providing groups of pixel electrodes and common electrodes and controlling each group with a different one or more integrated circuits.

13. The method of claim 1, further including electrically connecting the integrated circuits.

14. The method of claim 13, further including grouping the integrated circuits and serially connecting the integrated circuits in each group to the electronic control circuit.

15. The method of claim 13, further including electrically connecting the integrated circuits with row and column electrodes to the electronic control circuit.

16. The method of claim 1, further including segmenting the radiation-sensitive layer into spatially separate portions.

17. The method of claim 16, further including separating the portions between the integrated circuits.

18. The method of claim 1, further including forming the pixel electrodes in a two-dimensional array.

19. The method of claim 1, further including providing the electrical signal as a current or a charge.

20. The method of claim 1, further including providing the electronic circuits in a crystalline semiconductor in the integrated circuit.

21. The method of claim 1, further including forming a single common electrode co-extensive with the pixel electrodes over the active side of the first substrate, wherein the single common electrode is segmented.

22. The method of claim 21, further including segmenting the single common electrode into spatially separate portions that are separated between the pixel electrodes.

23. A method of using a radiation-sensitive apparatus made as set forth in claim 1, further including:
   providing electrical power to the integrated circuits and electronic control device;
   exposing the radiation-sensitive layer to patterned radiation;
   using the electronic control device to receive the electrical signals from the integrated circuit; and
   processing the electrical signals to form an image representative of the patterned radiation.

* * * * *